United States Patent [19]

Rissman et al.

[11] Patent Number: 5,661,043

[45] Date of Patent: Aug. 26, 1997

[54] FORMING A BURIED INSULATOR LAYER USING PLASMA SOURCE ION IMPLANTATION

[76] Inventors: Paul Rissman, 3509 Laguna Ct., Palo Alto, Calif. 94306; James B. Kruger, 164 Kelly Ave., Half Moon Bay, Calif. 94019; J. Leon Shohet, 1937 Arlington Pl., Madison, Wis. 53705

[21] Appl. No.: 280,103

[22] Filed: Jul. 25, 1994

[51] Int. Cl.$^6$ .................................................. H01L 21/265
[52] U.S. Cl. .......................... 438/162; 438/766; 438/407
[58] Field of Search ............................. 437/20, 21, 24, 437/26, 62, 928, 929, 938, 949

[56] References Cited

U.S. PATENT DOCUMENTS

| | | | |
|---|---|---|---|
| 4,746,394 | 5/1988 | Conrad | 427/38 |
| 4,764,394 | 8/1988 | Conrad | 427/38 |
| 4,808,546 | 2/1989 | Moniwa | 437/41 |
| 5,183,775 | 2/1993 | Levy | 437/24 |
| 5,196,355 | 3/1993 | Wittkower | 437/24 |
| 5,289,010 | 2/1994 | Shohet | 250/398 |
| 5,296,272 | 3/1994 | Matossian et al. | 427/523 |
| 5,311,028 | 5/1994 | Glavish | 250/292.21 |
| 5,436,175 | 7/1995 | Nakato et al. | 437/24 |
| 5,498,290 | 3/1996 | Matossian et al. | 118/723 E |

FOREIGN PATENT DOCUMENTS

| | | | |
|---|---|---|---|
| 3-19218 | 1/1991 | Japan | 21/316 |
| 3-268444 | 11/1991 | Japan | 21/76 |
| WO93/18201 | 9/1993 | WIPO | C23C 14/48 |

OTHER PUBLICATIONS

Torii et al., "A High Current Density and Long Lifetime ECR Source for Oxygen Implanters", Review of Scientific Instruments (Jan. 1990) vol. 61, No. 1, Pt. 2. pp. 253–255.

Torii et al, "Very High Current ECR Ion Source for an Oxygen Ion Implanter Nuclear Instruments and Methods in Physics Research", Section B, Mar. 87, vol. B21, No. 2–4, pp. 178–181.

Primary Examiner—Jey Tsai
Assistant Examiner—S. Mulpuri

[57] ABSTRACT

A method and apparatus for forming a buried insulator layer, typically a silicon dioxide layer, includes using plasma source ion implantation to uniformly implant ions into exposed regions of a semiconductor wafer. A silicon-on-insulator (SOI) structure is formed by an anneal step before fabricating an integrated circuit into the thin semiconductor layer above the buried insulator layer.

20 Claims, 5 Drawing Sheets

FORMING A BURIED INSULATOR LAYER USING PLASMA SOURCE ION IMPLANTATION

TECHNICAL FIELD

The present invention relates generally to forming semiconductor devices and more particularly to methods and devices for forming a buried insulator layer in a silicon substrate.

BACKGROUND ART

Typically, the thickness of a silicon wafer that is used in the fabrication of integrated circuit chips is approximately 500 microns. Usually, only the first micron at the top of the silicon wafer is used for transistor operation. Silicon-on-insulator (SOI) technologies provide convenient methods to produce devices in the top surface of the silicon wafer. Briefly, SOI can be described as completely surrounding devices with an insulator, rather than with a pn junction.

SOI carries the possibility of reducing process complexity for the fabrication of semiconductor devices. Moreover, SOI provides radiation immunity, which can be important for space and military applications. Junction isolation is less effective in high-radiation environments, since transient photocurrents are produced by gamma rays in pn junctions. Another advantage of SOI is that reduced capacitance of semiconductor devices that are produced by SOI increases the operational speed of transistors designed with the same dimensions as previous generations. That is, reductions in parasitic capacitance increase circuit speed. Circuit speed is further enhanced by reductions in microchip size allowed by SOI technologies.

An SOI structure can be formed using wafer bonding. This technology fuses two oxidized silicon wafers together using a high-temperature furnace. While this technology has produced favorable results in many applications, the approach is costly and is limited by the ability of the approach to achieve dimensional uniformity.

Another SOI technology is referred to as Separation by IMplanted OXygen (SIMOX). This technology has emerged as a promising candidate for Ultra Large Scale Integration (ULSI) CMOS applications. SIMOX wafers have been used in the fabrication of semiconductor devices that offer significant advantages in gain, speed, maximum operating temperature, and power consumption. Conventionally, SIMOX wafers have been fabricated by high dose, e.g. $1.8 \times 10^{18}$ ions/cm$^2$ and high energy, e.g., 150–200 KeV, ion beam implantation of O$^+$ ions. However, a recent development in SIMOX technology, referred to as Low Energy SIMOX (LES), uses low dose implantations of $1$–$6 \times 10^{17}$ ions/cm$^2$ at low energy in the range of 20–80 KeV with favorable results. It has been demonstrated that LES can produce SIMOX wafers having a 12.5 nm silicon overlayer and a 36 nm buried silicon dioxide layer by means of an ion beam implantation of O$^+$ at 20 KeV, with a total dose of $15 \times 10^{17}$ ions/cm$^2$, followed by a high temperature anneal. LES structures offer lower defect densities and lower production costs relative to conventional SIMOX techniques.

The operation of an ion beam implantation device is one in which an ion beam is extracted from a plasma source. The ion species of interest is extracted, while other ion species are rejected. The extracted ion beam is then accelerated to increase the ion energy to a desired energy level. Typically, beam currents are very small, e.g. in the milliampere range, with a beam "footprint" area that is a few square centimeters. The ion beam may be steered in order to provide full surface coverage, or the silicon wafer may be manipulated, or a combination of beam steering and wafer manipulation may be utilized. Often, thin "screen oxides" are grown to avoid damage to the surface of the silicon wafer. Temperature control is conventionally achieved by means of backside cooling through a wafer chuck, since the wafer is kept in high vacuum.

As an ion of the ion beam enters the surface of the silicon wafer, it loses energy as the ion collides with atomic nuclei and interacts with electrons in the wafer. Each collision and electronic interaction reduces the energy of the ion until it comes to rest within the wafer. Interactions follow a statistical process, and the profile of implanted ions often approximates a Gaussian distribution. The spread of the distribution of implanted ions is characterized by standard deviation and is called the straggle.

Ion beam implantation carries a number of advantages over other methods of forming SOI structures, e.g. wafer bonding. However, the serial processing by steering an ion beam across the wafer surface limits manufacturing throughput. Furthermore, complicated ion optics are required. Complications are increased if wafer manipulation is involved. Yet another concern is that in the employment of ion beam implantation, cost efficiency often imposes a lower energy limit for ion energies, so that there is a limit of how close the peak of the Gaussian distribution of settled ions can be to the top surface of the wafer.

What is needed is a method and apparatus for increasing manufacturing throughput for the fabrication of silicon-on-insulator structures. Also needed is a method and apparatus for reducing the limit to which shallow insulator layers can be formed into a silicon-on-insulator structure.

SUMMARY OF THE INVENTION

A method and apparatus is provided for concurrent area-wise implantation of an ion species for insulating a semiconductor substrate, typically a silicon wafer. The silicon wafer is connected to a source of a high voltage, so that the wafer attracts ions from an adjacent plasma environment, rather than being a target of a scanning beam of ions.

The silicon wafer is positioned on a support member in an enclosed chamber. The chamber is typically partially evacuated and heated. A plasma generated from a material selected to form a buried insulator layer in the silicon wafer is introduced into the chamber. A high negative voltage is applied to the semiconductor wafer. In response to the high negative voltage, electrons are directed away from the wafer and ions are set into motion toward the wafer. A cathode sheath is formed and the positive ions are accelerated to the silicon wafer. The ions reach the wafer with sufficient energy to be implanted into the wafer. In the preferred embodiment, the voltage that is applied to the silicon wafer is a pulsed high-voltage negative DC potential between the wafer and walls in the vacuum chamber. As the potential moves negatively, the sheath moves into the plasma, with electrons being "reflected" from the plasma-sheath boundary and kept in the plasma. The plasma-sheath boundary does not move the ions as it travels into the plasma, but instead sweeps through the ions. Ions trapped within the boundary are affected by the electric field in the sheath, causing the ions to be accelerated to the silicon wafer.

Temperature control of the silicon wafer in the moderately evacuated chamber in which the wafer resides can be achieved by presenting a backside gas. The prior art approach of ion beam implantation requires a high vacuum environment that limits the efficiency of a temperature control system that relies to any extent upon heat transfer by convection. Moreover, the high vacuum environment of ion beam implantation might generate substantial stress upon any seals to be used to isolate a temperature-control gas flow. In comparison, the relatively moderate vacuum environment of the present invention allows the gas that is selected as the source of the implanted ions to be channeled in a manner to provide efficient backside temperature control. Alternatively, an inert gas, such as helium or argon, can be used to control the temperature of the silicon wafer.

In the preferred embodiment, the ions to be implanted are oxygen ions. Thus, a SIMOX structure is formed. Other possible candidates for implantation are nitrogen and carbon, so that buried layers of silicon nitride and silicon carbide are formed using this technique in which ions are attracted from a plasma for concurrent implantation across the surface of a semiconductor substrate. A single device or one or more integrated circuits then can be formed in the thin surface layer of silicon.

Typically, an anneal is performed after the insulator material has been implanted into the silicon substrate, even though the implantation was performed at an elevated temperature. The anneal is in a neutral ambient, such as nitrogen, for a sufficient time to cause the silicon to react with the insulator material and to improve the quality of the silicon layer at the surface of the substrate and form a uniform buried insulating layer.

The technique has been referred to as "plasma source ion implantation" and has been used to surface-treat devices, such as hand tools and artificial hip joints, in order to significantly improve the wear-resistance and corrosion-resistance of the devices. In U.S. Pat. Nos. 4,764,394 to Conrad and 5,289,010 to Shohet and in International Publication No. WO 93/18201 of Felch et al., it is suggested that plasma source ion implantation can also be used to implant dopants, typically to increase the conductivity of a semiconductor substrate. However, this technique for increasing conductivity has not been readily accepted in semiconductor processing. As the ions reach the semiconductor substrate, surface sputtering occurs. The ejection of atoms from the surface adversely affects the resulting structure. In comparison, plasma source ion implantation in an oxygen plasma environment causes the silicon wafer to begin oxidizing between the negative pulses, so that the sputtering that occurs is primarily to the grown oxidation.

An advantage of the invention over the prior art technique of using beam implantation to form a buried insulator layer is that wide area processing can be performed simultaneously for a number of semiconductor substrates. Moreover, in comparison to ion beam implantation, a low energy limit for ion energies is not a significant factor. Another advantage is that complicated ion optics and/or wafer manipulation is not needed. The necessary equipment is available at a lower cost, and is used in a manner to achieve a high manufacturing throughput.

BEST MODE FOR CARRYING OUT THE INVENTION

Figure 1:
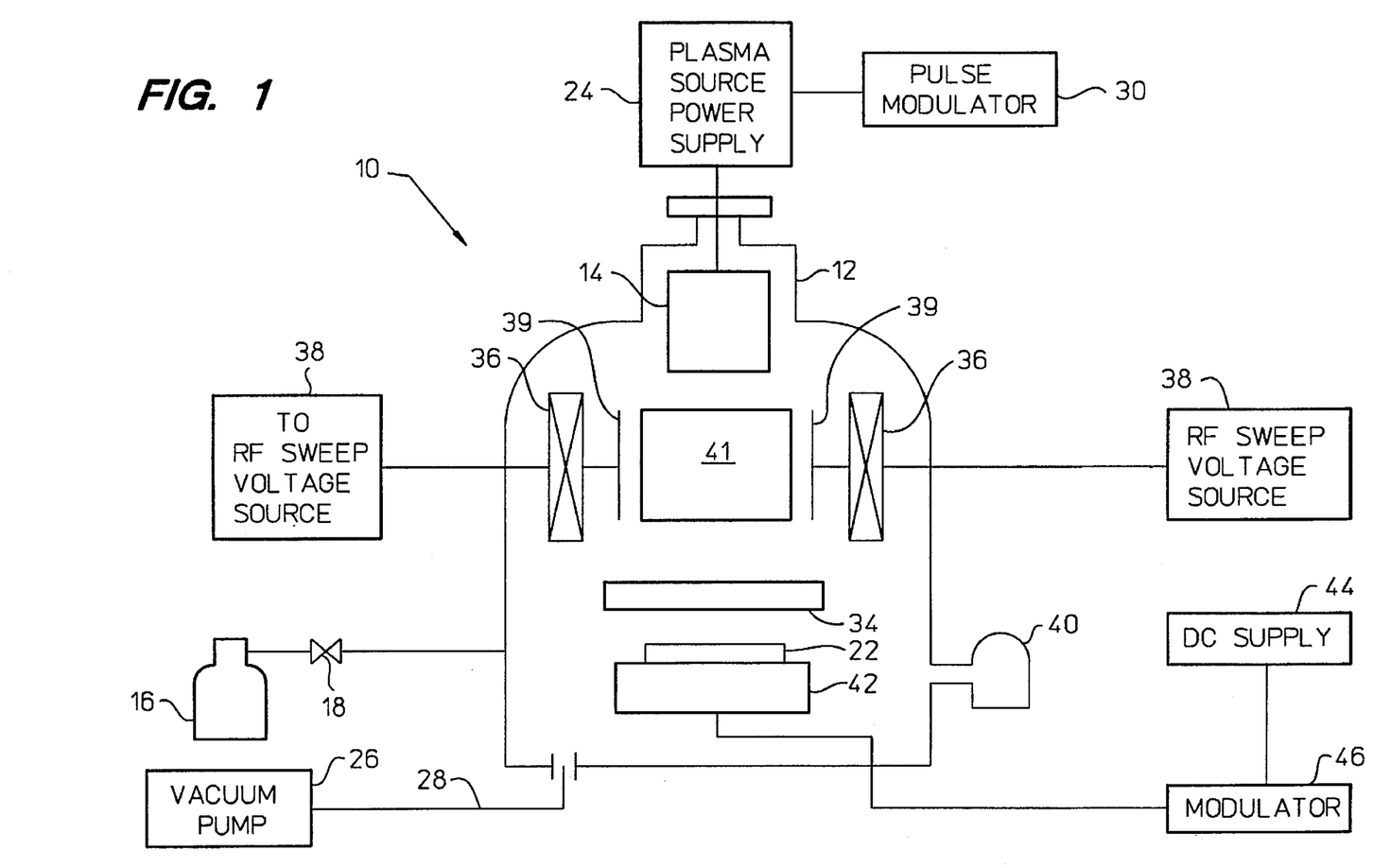
FIG. 1 is a block diagram of an apparatus for plasma source ion implantation of a semiconductor substrate in accordance with the invention.

With reference to FIG. 1, a plasma source ion implantation apparatus 10 is shown as including a vacuum chamber 12. Within the chamber is a plasma source 14 which generates a plasma from a gas introduced into the chamber from a supply 16. The flow from the supply 16 is controlled by a valve 18. Typically, an inlet line 20 from the supply to the vacuum chamber 12 is directed at the plasma source 14.

The supply 16 provides a gas for generating a plasma to introduce ions into a semiconductor wafer in order to provide an insulator layer. In the preferred embodiment, the insulator layer is a buried layer, such as a buried layer of $SiO_2$, $SiO_3N_4$ or $SiC$. The plasma source 14 is connected to a power supply 24, which is connected to a first pulse modulator 30. The plasma is generated in response to voltage pulses. The operation of the plasma source 14 is not critical to the operation of the plasma source ion implantation apparatus 10. The ionization of the gas from the supply 16 may be carried out using any known technique. A vacuum pump 26 is connected to an outlet 28 of the chamber 12 to provide the desired chamber pressure during operation.

An electrostatic shield grid 34 may be used to control the flow of ions from an upper region of the vacuum chamber 12 to the semiconductor wafer 22. An ionization gauge 40 is attached to the chamber 12 to allow assessment of the state of ionization within the chamber.

Also shown in FIG. 1 is an ion cyclotron resonance (ICR) system of the type described in U.S. Pat. No. 5,289,010 to Shohet. Unwanted ion species generated at the plasma source 14 can be removed by the ICR system that includes a solenoidal magnet 36 and a radio frequency sweep voltage source 38. The magnet 36 provides a substantially unidirectional and constant magnetic field in the region between a pair of excitation electrodes 39 and a pair of ion collector electrodes 41, only one of which is shown. The electrodes 39 and the plates 41 define an ion purification region. A radio frequency signal from the source 38 varies an electric field generated within the ion purification region. The varying electric field drives unwanted ions having charge-to-mass ratios different than that of the desired ion species to resonance with the electric field. As a result, the unwanted ions are driven outwardly in expanding spirals until the unwanted ions reach the ion collection plates 41 that remove the ions.

The semiconductor wafer 22 is supported on a stage 42 within the vacuum chamber 12. The stage is an electrically conductive member that receives pulses of a high negative voltage from a high voltage DC power supply 44 and a second pulse modulator 46. The modulator pulses a negative voltage, e.g., 0 V to −100 kV, from the power supply 44. As will be explained more fully below, ion implantation into the semiconductor wafer 22 occurs only during those times in which the stage 42 is biased negatively. The negative bias creates a plasma sheath that operates to impart the necessary ion energy for implanting ions into the semiconductor wafer 22.

In operation, four sample silicon wafers were implanted with oxygen ions using the apparatus 10 of FIG. 1. Each sample was a three-inch boron-doped (111) oriented silicon wafer with a resistivity of between 7.5 and 15 ohm/cm. The wafers were loaded into the vacuum chamber 12 and the vacuum pump 26 reduced the chamber pressure to a pressure within the range of $2$–$5\times10^{-6}$ Torr. The upper surface of the silicon wafer 22 was cleaned in order to remove native oxide from the surface.

An oxygen plasma was then generated by means of a filament plasma source 14. The high voltage DC supply 44 was adjusted to $-30$ kV. For the first three samples, the modulator 46 provided a pulse width of 40 µs, with the pulse width being 10 µs for the fourth sample. While not shown, the wafer-supporting stage 42 was water cooled in order to keep the temperature below 100° C. However, in practice it is desirable to maintain the temperature between 600° C. and 650° C. While not shown, introducing plasma source gas directly from the supply 16 to the backside of the wafer 22 provides a convenient means for controlling the temperature of the wafer. Alternatively, an inert gas may be introduced for the backside temperature control. During implantation, chamber pressure was maintained at approximately 0.2 mTorr.

In the oxygen plasma, it is estimated that 80% of the oxygen ions were $O_2^+$ and the remaining oxygen ions were $O^+$. The fact that $O_2^+$ was the dominant implanted species, rather than $O^+$ as is typical with conventional beam-line implantation, was not a strong concern. An implantation of $O_2^+$ at $-60$ kV gives a similar oxygen profile in silicon as an $O^+$ implantation at $-30$ kV. However, implanting a single ion species is preferred in most instances. The ICR system described above can be used to remove either $O_2^+$ or $O^+$.

As is known in the art, ion dosage can be controlled by the frequency, the duty cycle established at the modulator 46, and the total number of high voltage negative pulses to the stage 42. A high negative voltage will create a plasma sheath about the surface of the silicon wafer 22. The voltage repels electrons from the region near the wafer. As the potential of the stage 42 moves negatively, the boundary of the sheath moves farther from the surface of the wafer. The plasma-sheath boundary does not move ions as it expands. Rather, because the ions are more massive, the plasma-sheath boundary sweeps through the ions. When the ions are located within the boundaries, the ions are affected by the electric field in the sheath and are accelerated toward the wafer 22. The estimated ion dose of the first sample was $1.0\times10^{17}$ ions/cm$^2$. The estimated ion dose of the second sample was $5.5\times10^{16}$ ions/cm$^2$. The remaining two samples received an estimated ion dosage of $3.3\times10^{16}$ ions/cm$^2$.

While the first sample wafer was not subjected to an anneal, the second, third and fourth wafers were. An anneal temperature of 1300° C. was established for the second sample wafer in an ambient of $N_2+0.25\%$ $O_2$ for six hours. Each of the third and fourth sample wafers was annealed at 1080° C. in a neutral ambient of $N_2$ for seven hours.

Figure 2:
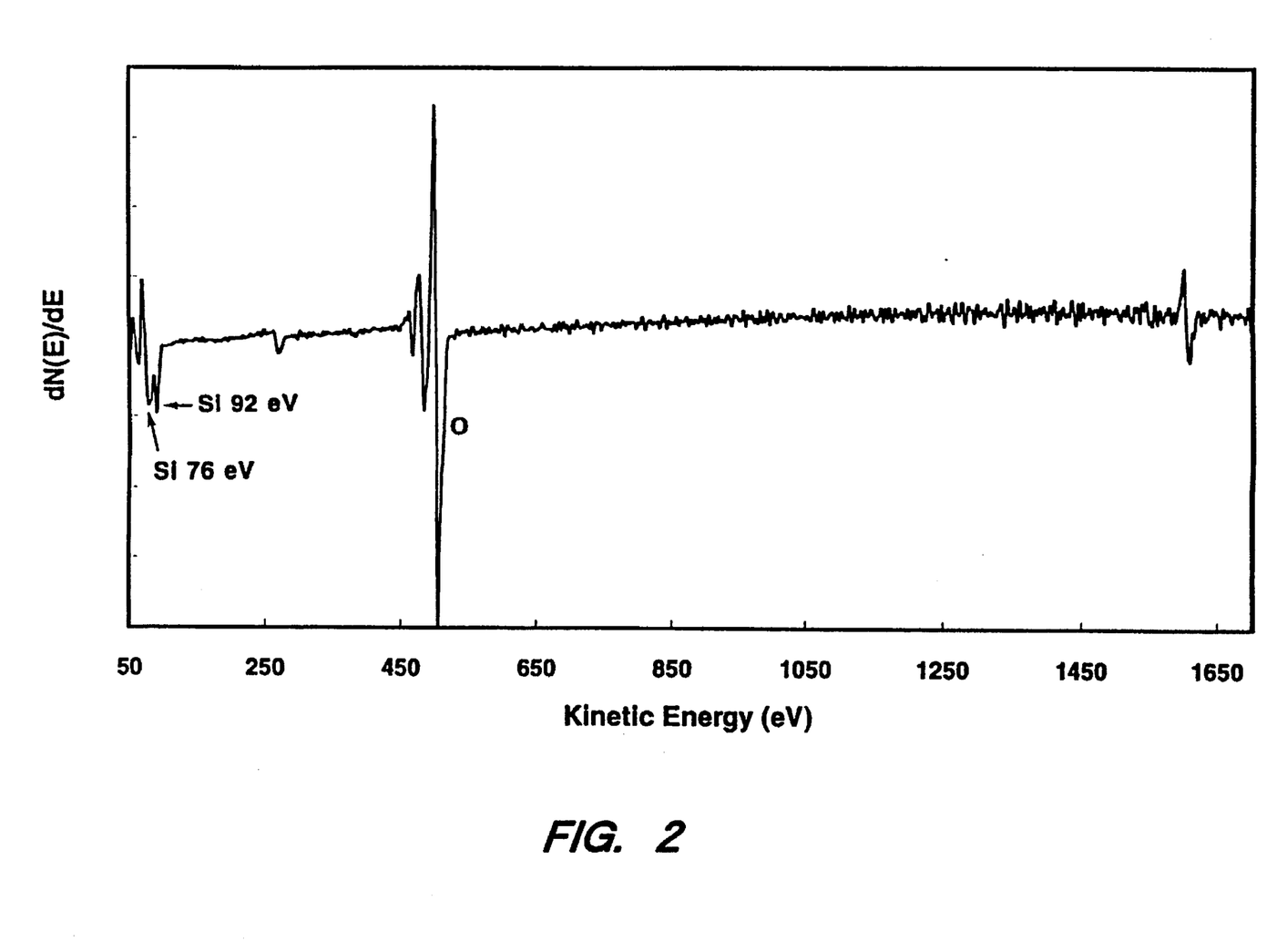
FIG. 2 is an Auger electron spectrum for a sample of a silicon wafer having implanted oxygen using the apparatus of FIG. 1.

Both the as-implanted wafer of sample one and the annealed wafers of samples two, three and four were examined by a secondary ion mask spectrometer (SIMS) and by Auger electron spectroscopy (AES). FIG. 2 shows the AES spectrum for the surface of the third sample wafer. Standard AES spectra show that a peak at 76 eV and 92 eV correspond to Auger electrons from silicon in $SiO_2$ and pure silicon, respectively. Both peaks are observed in FIG. 2, suggesting that there are silicon atoms left at the surface.

Figure 3:
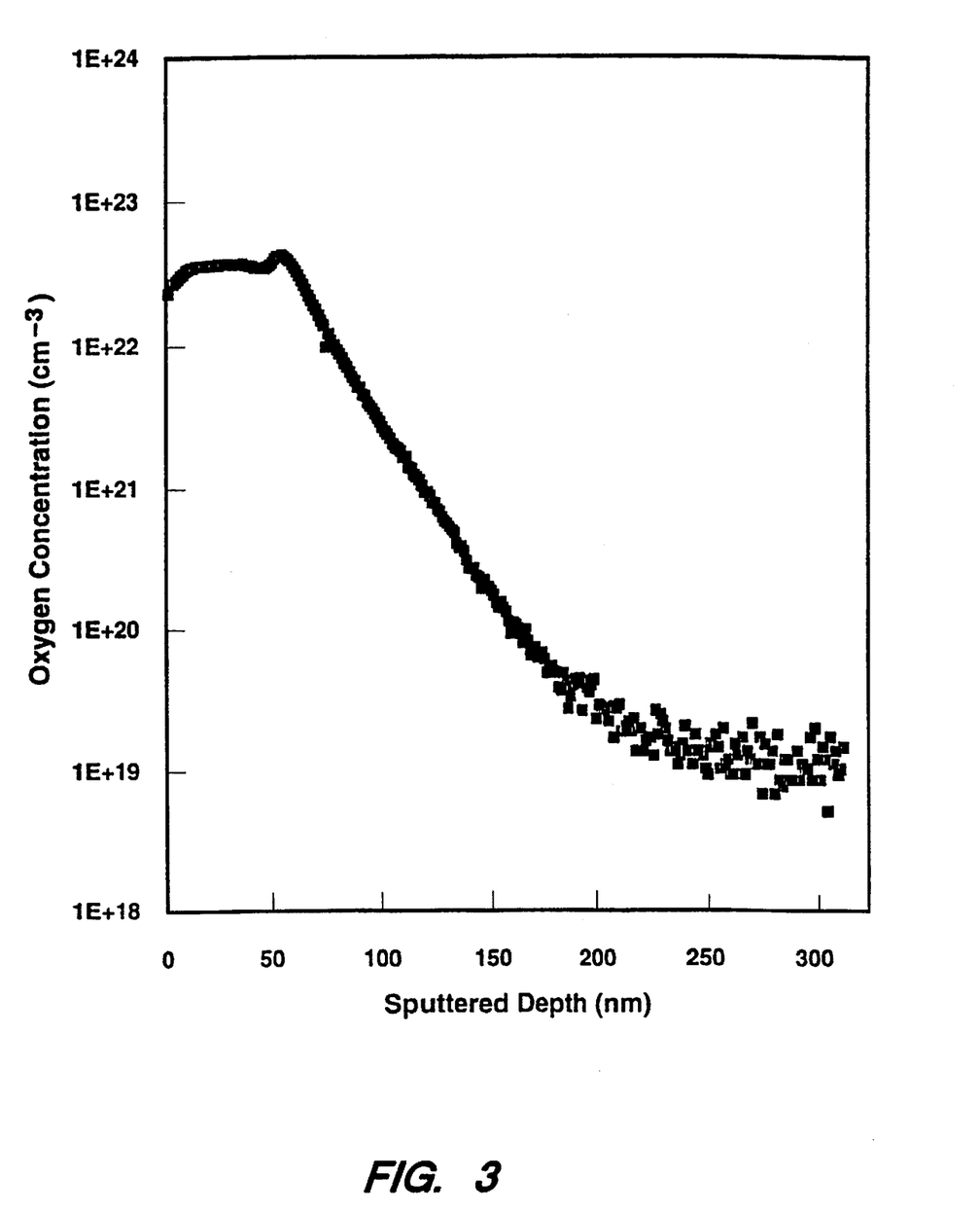
FIG. 3 is a secondary ion mass spectroscopy (SIMS) of an oxygen concentration profile of a second semiconductor wafer sample having oxygen implanted using the apparatus of FIG. 1.
Figure 4:
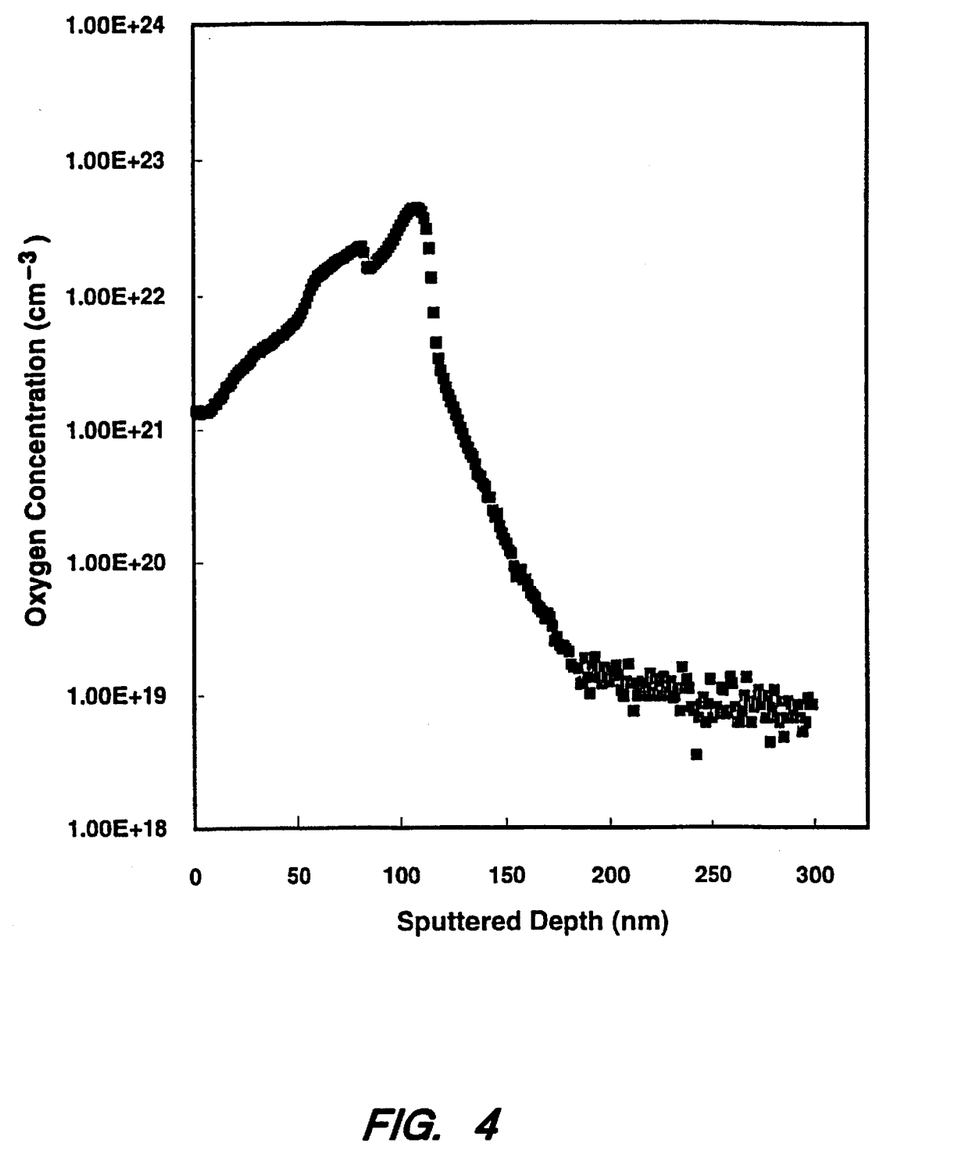
FIG. 4 is a SIMS oxygen concentration profile for the same second sample, but following an anneal.
Figure 5:
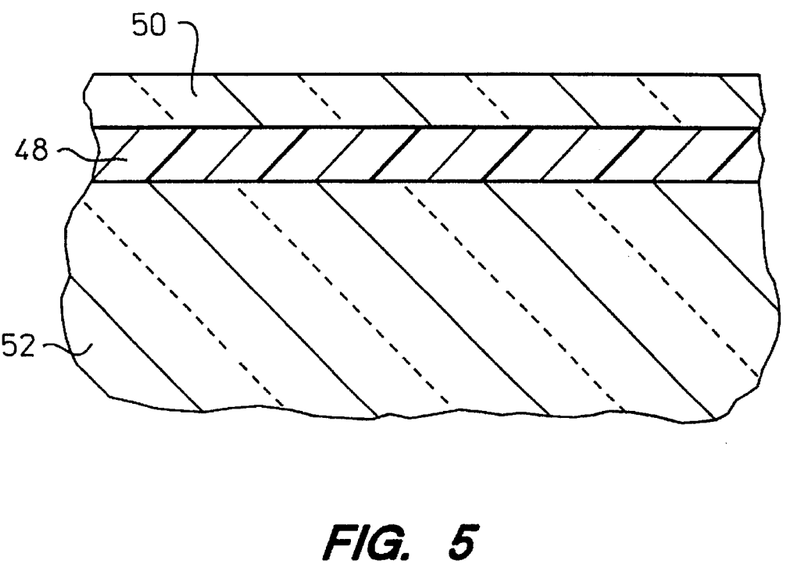
FIG. 5 is a side sectional view of a silicon-on-insulator structure of FIG. 4.
Figure 6:
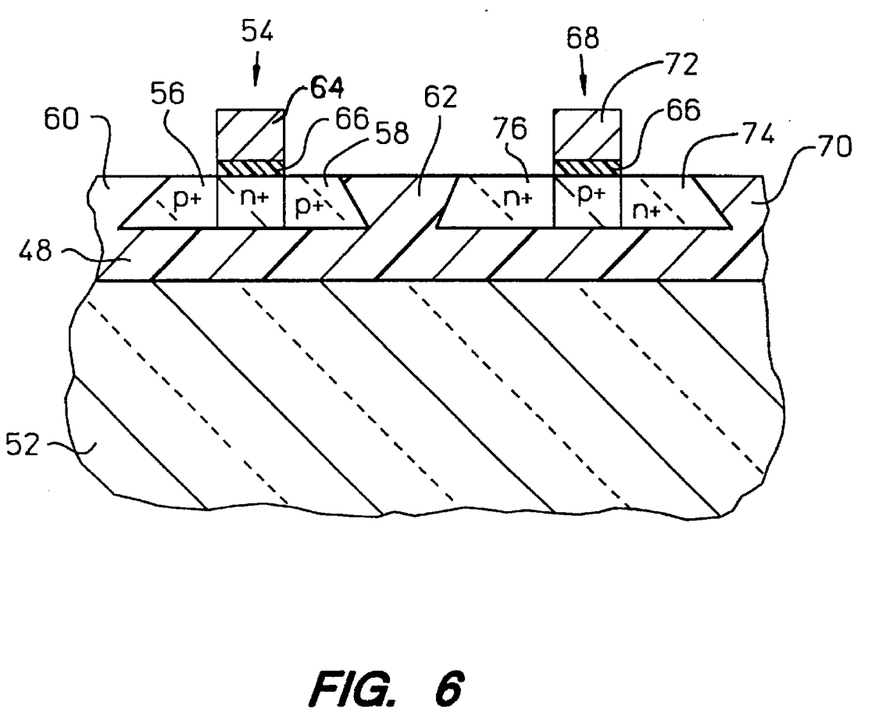
FIG. 6 is a side sectional view of the structure of FIG. 5 having transistors formed in the upper silicon layer.

FIG. 3 shows the oxygen concentration profile of the second sample wafer prior to the anneal, as a function of sputter depth from SIMS analysis. The oxygen concentration is generally uniform at $4\times10^{22}$ cm$^{-3}$ from the top surface to approximately 45 nm in depth. Since the oxygen concentration and stoichiometric silicon dioxide should be approximately $4\times10^{22}$ cm$^{-3}$, it can be inferred that silicon dioxide was formed in the near-surface region of uniform oxygen concentration. In comparison, the oxygen concentration profile of sample 2 following the above-described anneal is shown in FIG. 4. Most of the oxygen in the near-surface region of the annealed sample is no longer present within the region, leaving a thin layer of silicon having a low oxygen content. A thin $SiO_2$ layer is shown underneath. The resulting SIMOX structure is shown in FIG. 5. Implanted oxygen forms a buried insulator layer 48. Following conventional techniques, transistors can then be formed. In FIG. 6, a PMOS transistor having source/drain regions 56 and 58 could be formed between two field oxide regions 60 and 62. The PMOS transistor also includes a gate 64 on a gate oxide layer 66. An NMOS transistor 68 could be formed between field oxide regions 62 and 70. The NMOS transistor includes a gate 72 and source/drain regions 74 and 76. The structure of FIG. 6 is shown merely for example. Other transistor configurations may be formed.

Returning to FIG. 5, the silicon layer 50 of the annealed fourth sample was thinner than that of the annealed second sample. As previously noted, the annealing temperature of the fourth sample was 1080° C., while the anneal temperature of the second sample was 1300° C. It is believed that the lower anneal temperature of the fourth sample resulted in the thinner silicon layer. The results indicate that the buried $SiO_2$ layer 48 in the silicon wafer 52 is formed by plasma source ion implantation of oxygen followed by a thermal anneal.

The ion dose of $1.0\times10^{17}$ cm$^{-3}$ of the first sample may be too high for implantation at 30 KeV using plasma source ion implantation, since most all of the silicon atoms near the surface of the first sample were incorporated into $SiO_2$. However, this conclusion cannot be confirmed because estimations of ion doses may have been inaccurate. As a further note, by comparing SIMS data from the third and fourth samples, it was found that both the thickness of the buried insulator layer 48 and the oxygen concentration in the fourth sample were less, despite the fact that the estimated ion dosages were the same for the two samples. This suggests that the shorter pulse widths, 10 µs compared to 40 µs, can result in fewer implanted ions and shallower buried layers. It is presumed that in the ideal a change in pulse width would not significantly affect implantation, since in the ideal circumstances voltage transitions are instantaneous. However, in practice there is a voltage slope associated with each transition, so that it may be the transitions that cause the differences in the third and fourth samples.

As previously noted, a conventional method of forming a silicon-on-insulator (SOI) structure is to use a beam of ions to be implanted in a silicon wafer. The conventional beam-line implantation has resulted in thicker silicon layers for ion energies and doses similar to those selected to form the four samples. At least two explanations may be given for the shallower implantation depths for oxygen implantation by plasma source ion implantation. Firstly, the ion energy is relatively low. Since the majority of ion species of the apparatus 10 of FIG. 1 is $O_2^+$ and the target bias potential is 30 KeV, the implantation energy per oxygen atom is not greater than the equivalent of that of $O^+$ at 15 KeV. As a result, the mean projected range ($R_p$) can be very shallow. It is believed that the $R_p$ would be approximately 33 nm for amorphous silicon under such conditions. If one-half of the mean full range ($R_f$=26 nm) is deducted from $R_p$, there would be only 7 nm of silicon left on the surface. From this viewpoint, it seems that higher implantation energies, e.g. 40–60 KeV, should be used to achieve results equivalent to the prior art ion beam low energy SIMOX (LES) experiments. As an ion enters the surface of a semiconductor substrate, it collides with atoms and interacts with electrons. Each nuclear and electronic interaction reduces the energy of the ion until the ion comes to rest within the semiconductor substrate.

Typically, interactions follow a statistical process and the implanted profile is often approximated by a Gaussian distribution as follows:

$$N(x) = N_p \exp[-(x-R_p)^2/2\Delta R_p] \qquad (1)$$

where $R_p$ is the projected range and is equal to the average distance of ion travel into the semiconductor substrate. The peak concentration $N_p$ occurs at $x=R_p$. Because of the statistical nature of the process, some ions will penetrate beyond the projected range $R_p$ and some will come to rest before reaching the projected range. The spread of the distribution of the implanted ions is characterized by the standard deviation $\Delta R_p$ and is referred to as the "straggle." The area under the distribution curve expressed by equation (1) is the implanted dose Q, defined as:

$$Q = \int_0^\infty N(x) dx \text{ ions/cm}^2 \qquad (2)$$

If the implant is contained entirely within the target, and equation (1) applies, then:

$$Q = \sqrt{2\pi}\ N_P \Delta R_P \qquad (3)$$

The implanted dose can often be controlled to within a few percent. Range and straggle are roughly proportional to ion energy.

The second explanation for the observed shallower implantation depth using plasma source ion implantation, as compared to conventional ion beam implantation, follows from the understanding of projected range $R_p$. Implanted ions using plasma source ion implantation are distributed among a range of energies. The energy spread gives rise to ion energies below a target ion energy, e.g. below 30 KeV. These low energy ions may be implanted near the surface region or, as will be described below, may sputter the target surface. There are a number of possible causes for the ion energy spread. Variations of target bias potential during the pulse rise and fall times, as well as electrostatic charge-up of the semiconductor surface can cause low energy implanted ions. Other possible sources of low energy ions include ion-neutral charge exchange and interactions within the plasma sheath that is created by biasing the semiconductor substrate.

As previously noted, the plasma source ion implantation process may cause sputtering of the top surface of the semiconductor substrate 22 of FIG. 1. However, where the plasma environment formed within the vacuum chamber 12 is an oxygen environment, sputtering of the semiconductor substrate as a pulse is initiated is less likely to significantly affect the semiconductor material. Instead, oxygen is grown on the top surface between the pulses, and it is the grown oxide that is sputtered. Thus, damage to the substrate is less likely to occur.

Returning to FIG. 6, plasma source ion implantation can also be used to form transistors 54 and 68 following formation of a buried layer 48 by implantation of nitrogen to form a Separation by IMplantation of NItrogen (SIMNI) structure or by implantation of oxygen and nitrogen to form a Separation by IMplantation of Oxygen and Nitrogen (SIMON) structure. However, the SIMOX technology appears to offer the greatest possibilities.

We claim:

1. A method of fabricating circuitry in a semiconductor substrate comprising:

generating a plasma from a material selected to render a region of said semiconductor substrate electrically insulative when combined with said semiconductor substrate;

forming an environment of said plasma adjacent to a surface of said semiconductor substrate;

forming a semiconductor on insulator structure, including accelerating ions from said plasma within said environment toward said surface of said semiconductor substrate such that said ions are implanted into said semiconductor substrate, said acceleration of ions from said plasma including attracting said ions by forming an electric field at said semiconductor substrate, thereby forming insulative material into said semiconductor substrate, wherein accelerating said ions includes pulsing a negative voltage applied to said semiconductor substrate;

following said formation of insulative material into said semiconductor substrate with an anneal such that said insulative material reacts with semiconductor material of said semicondutor substrate; and forming at least one electronic device in said semiconductor on insulator structure.

2. The method of claim 1 wherein generating said plasma includes selecting said material for forming said plasma from the group of materials consisting of oxygen, nitrogen and carbon.

3. The method of claim 1 wherein said semiconductor substrate is silicon.

4. The method of claim 1 wherein accelerating said ions is carried out to form a buried layer of said insulative material, including achieving a particular depth of ion implantation by selecting a voltage to form said electric field.

5. The method of claim 4 wherein selecting said material for generating said plasma is a step of selecting oxygen, said method further comprising oxidizing said surface of said semiconductor substrate between periodic pulses of said acceleration of said ions from said plasma.

6. The method of claim 1 further comprising positioning said semiconductor substrate in a chamber and evacuating said chamber prior to forming said environment of plasma adjacent to said surface.

7. The method of claim 1 wherein applying said voltage to said semiconductor substrate is a step including applying negative DC pulses.

8. The method of claim 7 wherein forming said environment is a step of forming a plasma which causes oxidation of said surface of said semiconductor substrate between said pulses.

9. The method of claim 1 further comprising controlling the temperature of said semiconductor substrate during forming said insulative material into said semiconductor substrate, including introducing gas into thermal communication with a side of said semiconductor substrate opposite to said surface toward which said ions are accelerated.

10. A method of forming a buried insulator layer in a semiconductor substrate comprising:

positioning said semiconductor substrate in a chamber;

using plasma source ion implantation to introduce a material into said semiconductor substrate, including the substeps of (a) selecting said material based upon insulative properties of said buried insulator layer to be formed, (b) forming a plasma of ions of said selected material within said chamber, and (c) forming an electrical field within said chamber to impart sufficient kinetic energy to ions within said plasma such that said ions are implanted into said semiconductor substrate in simultaneous areawise coverage, wherein forming said electrical field includes pulsing a high negative voltage to said semiconductor substrate; and annealing said semiconductor substrate such that a surface layer having semiconductive properties is provided and such that said material reacts with said semiconductor substrate to form said buried insulator layer.

11. The method of claim 10 wherein said semiconductor substrate is a silicon wafer and wherein said material selected is oxygen.

12. The method of claim 10 wherein said method further comprising a step of oxidizing said semicondutor substrate between pulses of said high negative voltage.

13. The method of claim 11 further comprising controlling the temperature of said semiconductor substrate using gas flow of said selected material on a side of said semiconductor substrate opposite to said surface layer.

14. A method of fabricating circuitry in a semiconductor substrate comprising:

generating a plasma from a material selected to render a region of said semiconductor substrate electrically insulative when combined with said semiconductor substrate;

forming an environment of said plasma adjacent to a surface of said semiconductor substrate;

accelerating ions from said plasma within said environment toward said surface of said semiconductor substrate such that said ions are implanted into said semiconductor substrate, including attracting said ions by forming an electric field at said semiconductor substrate, thereby forming insulative material into said semiconductor substrate, wherein accelerating said ions includes pulsing a negative voltage applied to said semiconductor substrate;

annealing said semiconductor substrate following said forming insulative material into said semiconductor substrate, wherein a semiconductor-on-insulator structure is formed; and forming at least one electronic device in said semiconductor on insulator structure.

15. The method of claim 14 wherein generating said plasma includes selecting said material for forming said plasma from the group of materials consisting of oxygen, nitrogen and carbon.

16. The method of claim 14 wherein said semiconductor substrate is silicon.

17. The method of claim 14 wherein accelerating said ions is carried out to form a buried layer of said insulative material, including selecting a voltage to form said electric field based upon a predetermined depth of ion implantation.

18. The method of claim 14 further comprising positioning said semiconductor substrate in a chamber and evacuating said chamber prior to forming said environment of plasma adjacent to said surface.

19. The method of claim 14 wherein applying said voltage to said semiconductor substrate is a step including applying negative DC pulses and allowing oxidation between said negative DC pulses.

20. The method of claim 14 further comprising controlling the temperature of said semiconductor substrate during forming said insulative material into said semiconductor substrate, including introducing gas into thermal communication with said semiconductor substrate.

* * * * *